(12) United States Patent
Chia et al.

(10) Patent No.: US 7,214,100 B1
(45) Date of Patent: May 8, 2007

(54) CABLE ASSEMBLY

(75) Inventors: Vic Hong Chia, Plano, TX (US); Martha G. Peterson, McKinney, TX (US); Robert W. Skoog, Plano, TX (US); Terrel L. Morris, Garland, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/273,302

(22) Filed: Nov. 14, 2005

(51) Int. Cl.
*H01R 25/00* (2006.01)
(52) U.S. Cl. .................................................. 439/638
(58) Field of Classification Search ............... 439/638, 439/640, 650, 651
See application file for complete search history.

(56) References Cited

U.S. PATENT DOCUMENTS

| | | | | |
|---|---|---|---|---|
| 4,146,291 A | * | 3/1979 | Goff et al. ..................... 439/90 |
| 4,480,835 A | * | 11/1984 | Williams ................. 273/148 B |
| 5,155,663 A | * | 10/1992 | Harase ........................ 361/684 |
| 5,567,180 A | * | 10/1996 | Seo .............................. 439/638 |
| 6,065,992 A | * | 5/2000 | Wu et al. .................... 439/383 |
| 6,767,253 B1 | * | 7/2004 | Werner et al. .............. 439/638 |
| 6,908,324 B1 | * | 6/2005 | Morley et al. .............. 439/218 |
| 6,981,068 B1 | * | 12/2005 | Harari et al. .................. 710/2 |
| 2005/0116685 A1 | * | 6/2005 | Liu et al. .................... 320/116 |

* cited by examiner

*Primary Examiner*—Neil Abrams

(57) ABSTRACT

A cable assembly comprising a hollow sleeve, an electrical conductor within the hollow sleeve, and first and second connectors on opposing ends of the electrical conductor that are fastened to opposing ends of the sleeve. The first connector is adapted to blind-mate to a corresponding connector in a cabinet backplane and the second connector is adapted to couple to an electronic device to be installed in the cabinet. Power is provided from the backplane to the electronic device via the electrical conductor. The hollow sleeve is disposed within a tunnel supported by the cabinet. The hollow sleeve has a length greater than that of the tunnel such that the first connector protrudes from a first opening of the tunnel and the second connector protrudes from a second opening of the tunnel.

21 Claims, 6 Drawing Sheets

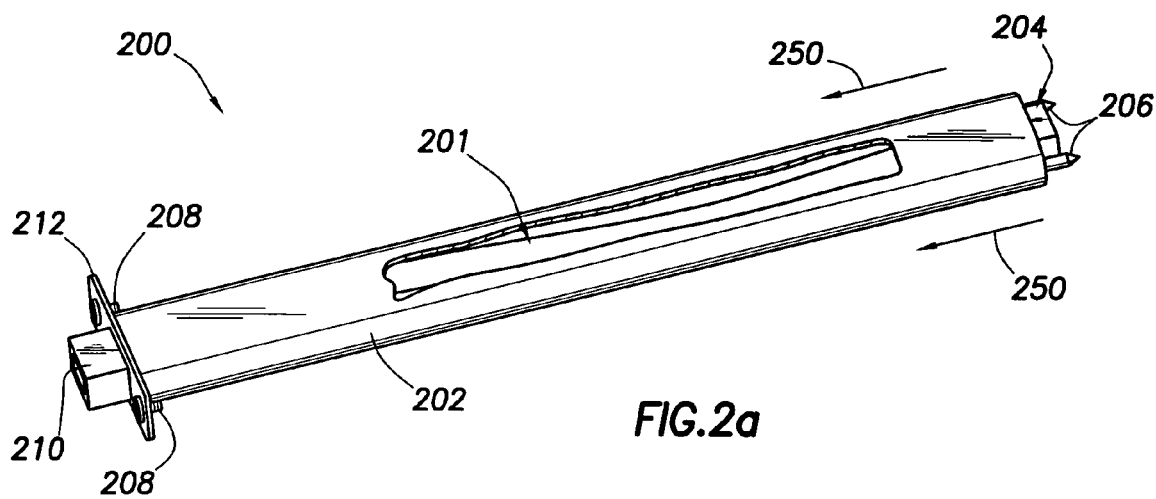
FIG.2a
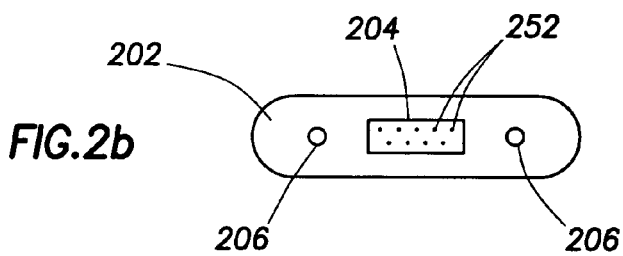
FIG.2b
FIG.6a
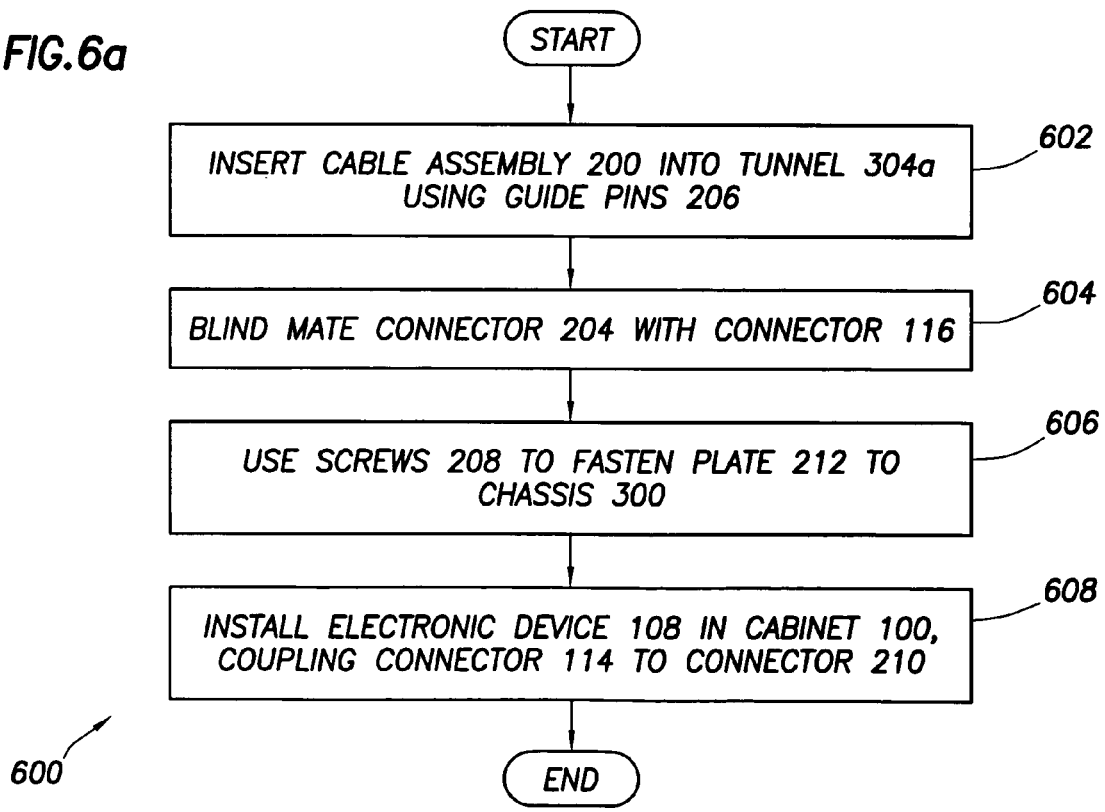

CABLE ASSEMBLY

BACKGROUND

Electronic devices, such as servers and computers, often are installed in power distribution cabinets. A power distribution cabinet receives power from an external source, which power is provided to a backplane of the cabinet. The backplane of the cabinet provides power to the electronic devices housed in the cabinet via busbars and/or cables coupled therebetween. Busbars and cables are difficult to install and are expensive to repair.

BRIEF DESCRIPTION OF THE DRAWINGS

For a detailed description of exemplary embodiments of the invention, reference will now be made to the accompanying drawings in which:

FIG. 2a shows a 3D view of an illustrative cable assembly housed within a cable assembly sleeve, in accordance with embodiments of the invention;

FIG. 2b shows a plan view of the sleeve of FIG. 2a, in accordance with embodiments of the invention;

FIGS. 6a and 6b show flow diagrams of processes used to install or repair an electronic device and/or a cable assembly in a PDC, in accordance with embodiments of the invention.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein is a cable assembly sleeve capable of housing a cable that is used to electrically couple a power distribution cabinet (PDC) backplane to an electronic device housed within the PDC. The sleeve is made of a substantially rigid material and comprises additional features that facilitate the installation of cable assemblies and electronic devices in PDCs.

Figure 1:
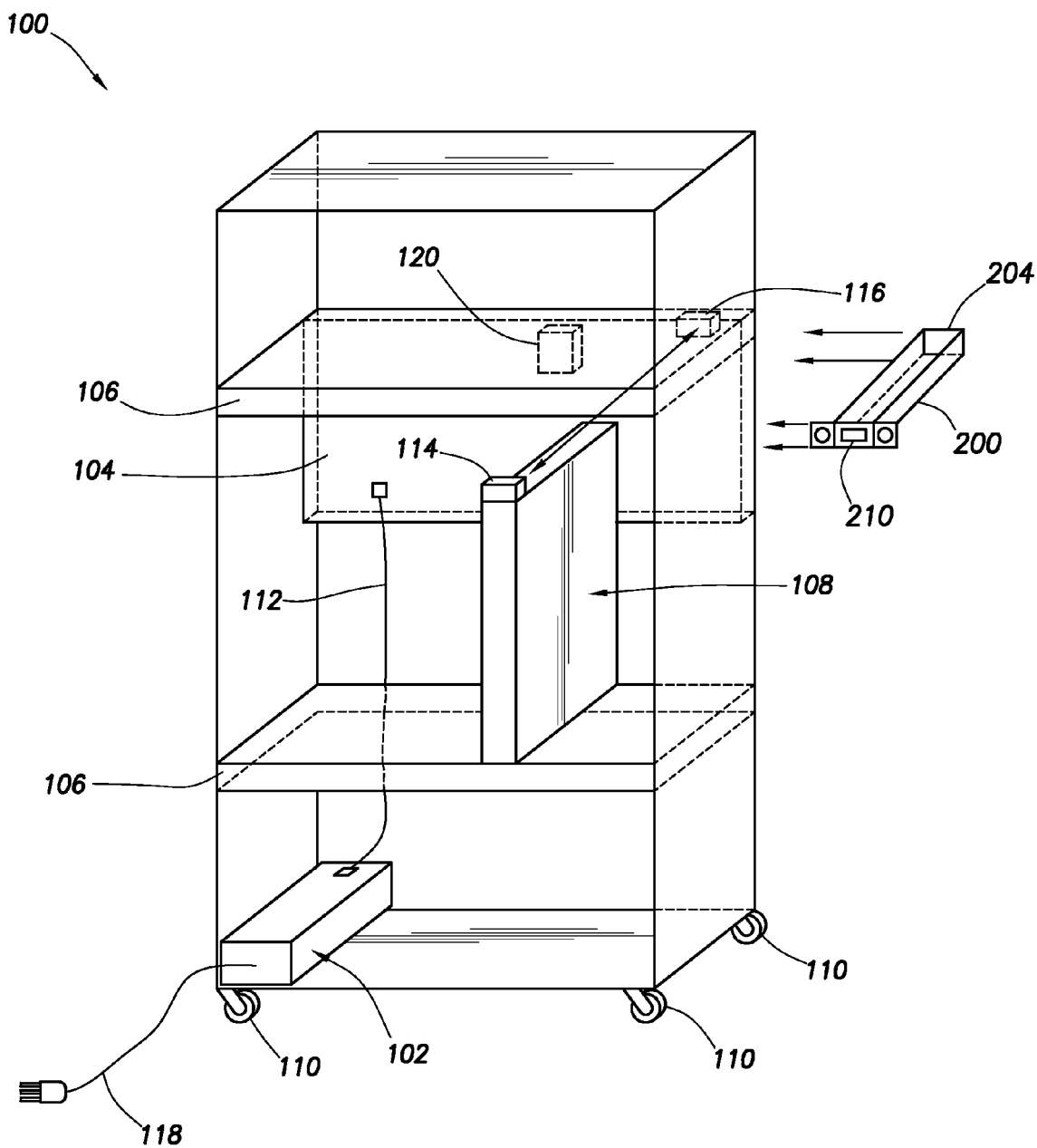
FIG. 1 shows a three-dimension (3D) view of an illustrative power distribution cabinet (PDC), in accordance with embodiments of the invention.

FIG. 1 shows a three-dimensional view of a PDC 100. The PDC 100 comprises a power source 102, a backplane 104 and an electronic device 108 which rests on one of a plurality of horizontal shelves 106. In at least some embodiments, the electronic device 108 is a cell board, which is a logic board that may comprise components such as power converters, data buses, processors, memory, etc. In some such embodiments, multiple cell boards may be housed within a system, such as a server, as described further below. The PDC 100 comprises wheels 110 to facilitate movement of the PDC 100, although the wheels 110 are not necessary. The power source comprises a power connection 118, which in some embodiments comprises a plug that may be mated to an alternating current (AC) wall outlet. The power source 102 receives power via the power connection 118 and, in turn, provides AC or direct current (DC) power to the backplane 104 via a power connection 112. The backplane 104 comprises a plurality of power connectors, such as the connector 116 shown in the figure. The connector 116 corresponds to a connector 114 on the electronic device 108. By coupling the connector 116 to the connector 114, the device 108 is powered. Thus, the transfer of power is as follows: a power source external to the cabinet 100 provides power to the power source 102 via the power connection 118; the power source 102 provides power to the backplane 104 via the power connection 112; and the backplane 104 provides power to the electronic device 108 via connector 116 which is coupled to connector 114. Power provided by the backplane 104 is regulated by a power management processor 120 housed in the backplane 104, as described further below.

In accordance with embodiments of the invention, FIG. 2a shows a conductive cable assembly 200 that is used to electrically couple the connector 116 to the connector 114, thus providing power from the backplane 104 to the electronic device 108. The cable assembly 200 comprises a cable 201 that is housed in a rigid, hollow, partially insulative sleeve 202. The sleeve may be made of a plastic material, such as polyvinyl chloride (PVC), acrylonitrile-butadiene-styrene (ABS), or any of a variety of other plastics. At least some of the plastics that may be used to manufacture the sleeve 202 are provided in *Industrial Plastics*, by Terry L. Richardson et al., Thomson Delmar Learning, September 2003, incorporated herein by reference. Alternatively, the sleeve 202 may be manufactured using non-plastics. The cable 201 may comprise any suitable conductive material, such as copper wiring, and an insulative material such as plastic around the conductive material. In some embodiments, the cable 201 may be incorporated into the sleeve 202 during a sleeve-molding process or, in other embodiments, the cable 201 may be incorporated into an already-formed sleeve 202. Although the various embodiments disclosed herein are described in terms of a cable, at least some of these embodiments may substitute a rigid, metal (e.g., copper) bar in place of the cable.

Regardless of the material used to manufacture the sleeve 202, in at least some embodiments, the material has an approximate resistivity of $10^8$ Ohms/square unit (e.g., square inch, square centimeter). The scope of disclosure is not limited to using a material that is approximate to $10^8$ Ohms/square unit. In general, the material used to manufacture the sleeve 202 is sufficiently insulative to prevent arcing between the cable assembly 200 and an adjacent cable assembly. However, the sleeve 202 also is sufficiently conductive to prevent an electrostatic discharge at the connector 114, thus preventing damage to the connector 114 and/or the electronic device 108. The shape of the sleeve 202 may be a cylinder with a circular, rectangular or elliptical cross section, although any shape may be used. The size (e.g., length, width, thickness) of the sleeve 202 is application-specific and may be adjusted as desired.

The sleeve 202 comprises connectors 204 and 210 on either end as shown. Each connector 204, 210 is coupled to the cable 201 housed inside the sleeve 202, so that current flows between the connectors 204, 210 via the cable 201. The connectors 204, 210 couple to the connectors 116, 114, respectively. The connectors 204, 116 and the connectors 210, 114 can be any type of connectors, as long as the connectors 204, 116 and the connectors 210, 114 can be coupled to each other. For instance, the connector 204 may comprise a plurality of male pins which mate to a female connector 116, or vice versa. Other types of connections may be used as desired.

The sleeve 202 optionally comprises multiple guide pins 206 that may be manufactured using the same material as the sleeve 202. As shown in FIG. 2a, the guide pins 206 are located on the same end of the sleeve 202 as the connector 204. In some embodiments, the guide pins 206 may comprise bullet-shaped (e.g., cylindrical) protrusions, although the scope of disclosure is not limited as such. The guide pins 206 are used to aid in guiding the connector 204 to "blind-mate" with the connector 116, as described further below. The sleeve 202 also comprises a plate 212 that is coupled to the same end as the connector 210. Captive screws 208, as well as the connector 210, may protrude through the plate 212. The captive screws 208 protrude through the plate 212 on opposing sides of the connector 210. The plate 212 and/or the screws 208 may be metal, plastic, or any other suitable type of material and of any suitable size and shape. For instance, as shown in FIG. 2a, the plate 212 may be of a substantially rectangular shape. The captive screws 208 and the plate 212 are used as described further below.

FIG. 2b shows a plan view of the cable assembly 200 as indicated by arrows 250 in FIG. 2a. In particular, FIG. 2b shows the end of the assembly 200 that comprises the connector 204 and the guide pins 206. The connector 204 is shown comprising multiple male connection pins 252, although the scope of disclosure is not limited to using such pins to establish electrical connections between connectors. The connector 204 is fastened by the sleeve 202 such that the connector 204 is substantially immovable. That is, the connector 204 is tightly fastened by the sleeve 202 such that there is little or no "wiggle room" for the connector 204. Such fastening of the connector 204 to the sleeve 202 aids in "blind-mating" the connector 204 to the connector 116, as described further below. The guide pins 206 may be formed as part of the sleeve 202, or the guide pins 206 may be formed separately from the sleeve 202 and subsequently attached to the sleeve 202.

Figure 3:
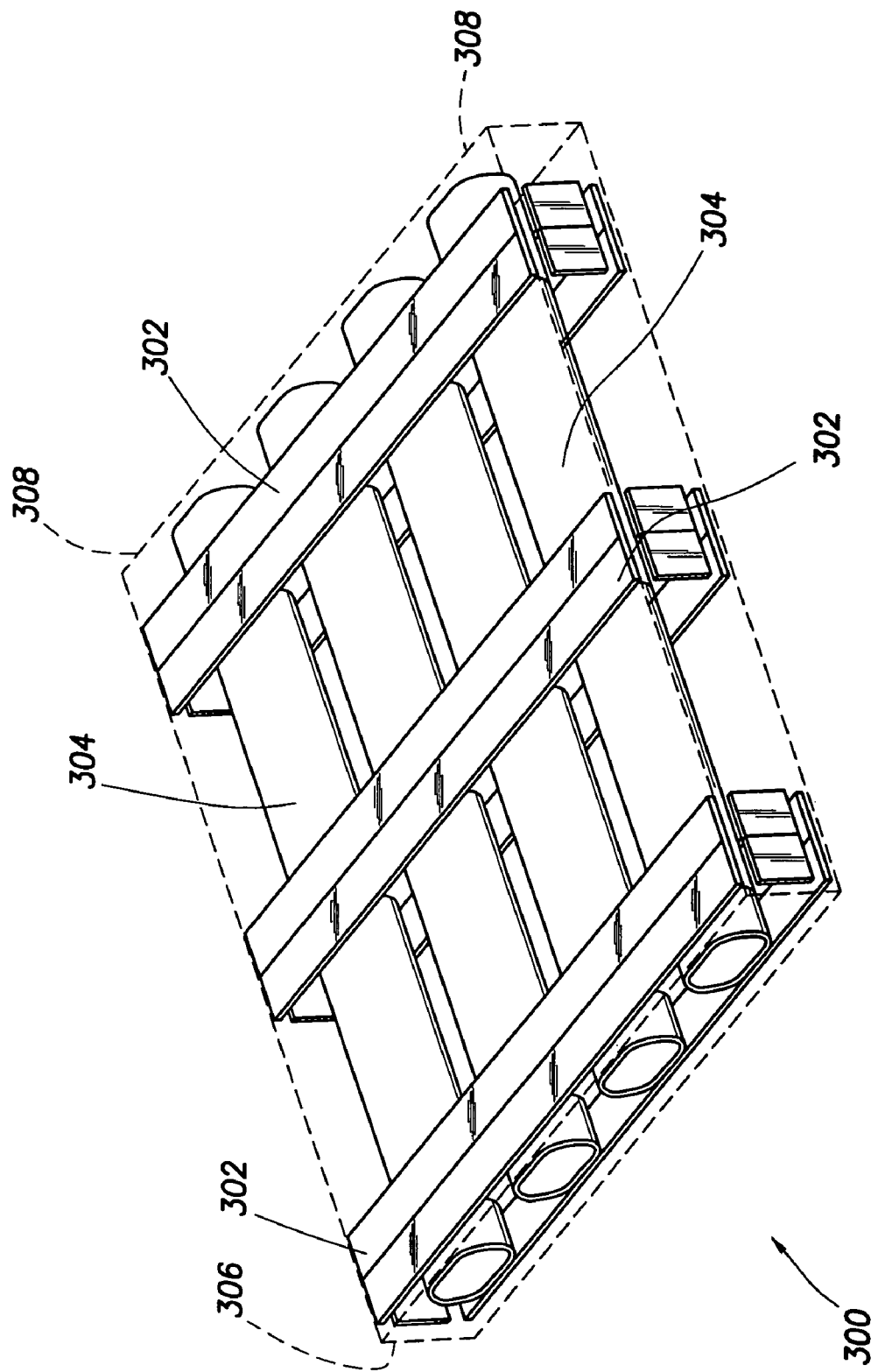
FIG. 3 shows a 3D view of a chassis used to protect and guide the cable assembly sleeve as the sleeve is coupled to a backplane of the cabinet, in accordance with embodiments of the invention.

FIG. 3 shows a chassis 300 that is housed in the cabinet 100 (not shown in the cabinet 100 of FIG. 1). More specifically, the chassis 300 is located between the electronic device 108 and the backplane 104. The chassis 300 contains a frame comprising multiple I-beams 302 and multiple tunnels 304 formed between the I-beams 302 as shown. Each tunnel 304 is hollow and has an opening on each end of the tunnel. Each tunnel has one opening that is exposed to front-side plane 306 and another opening that is exposed to back-side plane 308. Back-side plane 308 is substantially parallel to front-side plane 306. As shown, the tunnels 304 are arranged substantially perpendicular to the I-beams 302. The I-beams 302 serve to support the tunnels 304. The I-beams 302 may be supported in the cabinet 100 by any suitable structure, such as the walls of the cabinet 100. In at least some embodiments, the chassis 300 comprises a resistive material, such as PVC or ABS, although the scope of disclosure is not limited to these materials.

Figure 4:
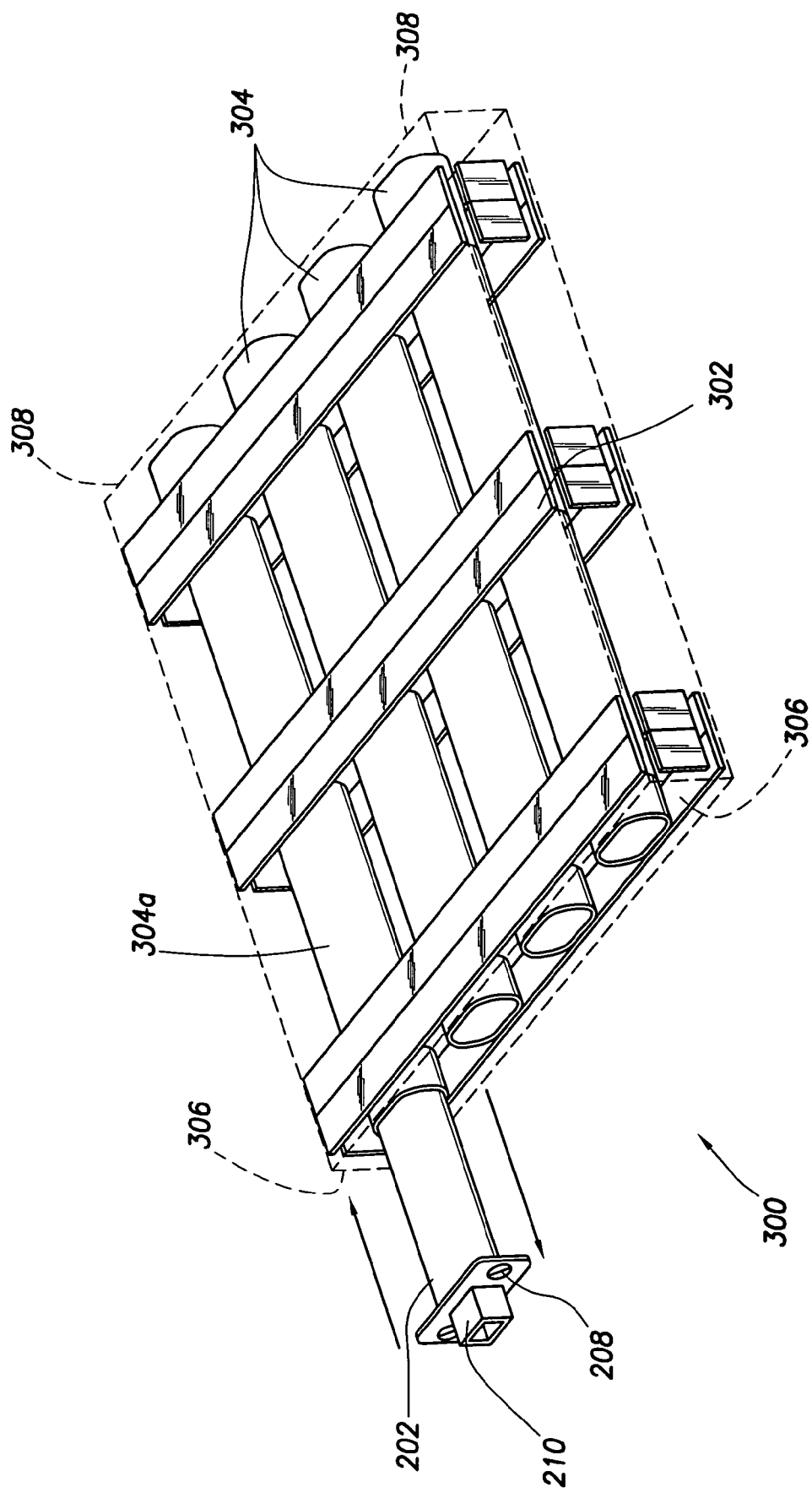
FIG. 4 shows a 3D view of the installation of the cable assembly and sleeve in a PDC chassis, in accordance with embodiments of the invention.

FIG. 4 shows the insertion of the cable assembly 200 into a tunnel 304a of the chassis 300. The sleeve 202 is inserted into an opening of the tunnel 304a which is exposed on a front-side plane 306 of the chassis 300. In at least some embodiments, the assembly 200 is inserted such that the connector 210 is exposed to the front-side plane 306 and the connector 204 is exposed to the back-side plane 308. The tunnel 304a is of a size (e.g., length, width) such that the assembly 200 fits snugly into the tunnel 304a and such that the connectors 210, 204, when the assembly 200 is fully inserted into the tunnel 304a, are able to couple to connectors 114, 116, respectively, as described below. Although not specifically shown, additional cable assemblies may be inserted into the other tunnels 304 in the chassis 300 to provide power from the backplane 104 to additional electronic devices in the cabinet 100.

Figure 5:
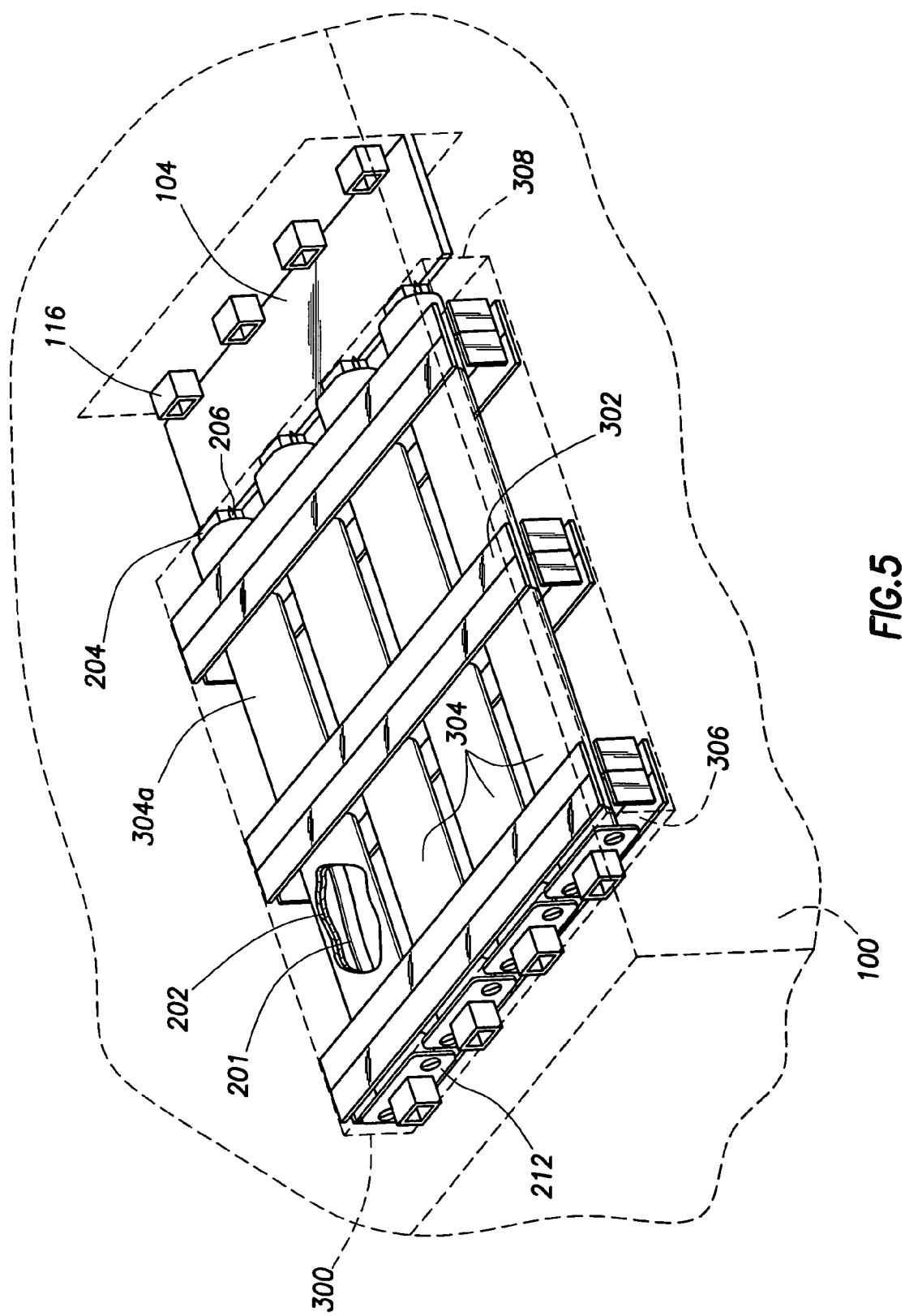
FIG. 5 shows a 3D view of multiple cable assemblies and sleeves installed in the PDC chassis, in accordance with embodiments of the invention.

FIG. 5 shows the chassis 300 installed in the cabinet 100. Each tunnel 304 in the chassis 300 houses a cable assembly. For illustrative purposes, tunnel 304a is shown with portions of the tunnel 304a and portions of the sleeve 202 removed. As can be seen, the tunnel 304a comprises the cable 201 housed within the sleeve 202. The connector 204 and the guide pins 206 protrude from the tunnel 304a at the back-side plane 308 when the plate 212 abuts the tunnel 304a.

The chassis 300 is installed in the cabinet 100 at a distance from the backplane 104 such that, when the assembly 200 is fully inserted in the tunnel 304a, the connector 204 snugly couples with the connector 116 on the backplane 104. In some embodiments, the optional guide pins 206 mate with holes (not specifically shown) on opposing sides of the connector 116 on the backplane 104. When the chassis 300 is installed in the PDC 100, an assembly 200 can be inserted into a tunnel (e.g., tunnel 304a), causing the connector 204 on sleeve 202 to electrically couple with the corresponding connector 116 on the backplane facilitated, if desired, by the guide pins 206 mating with corresponding holes. Just as the assembly 200 has a connector 204 that mates with the connector 116, the assemblies inserted into the other tunnels 304 also have connectors (and optionally, guide pins) that couple to the backplane 104 via connectors on the backplane 104.

FIG. 6a shows a process 600 that may be used to install an electronic device 108 in the cabinet 100. The process begins by inserting assembly 200 into a tunnel 304 (block 602) and blind mating the connector 204 with the connector 116 (block 604). The term "blind mating" implies that due to the rigidity of the sleeve 202, the connector 204 may be readily mated to the connector 116, regardless of whether the connectors 204, 116 are visible to a user coupling the connectors 204, 116. More specifically, the sleeve 202 facilitates the blind mating of the connectors 204, 116 because the sleeve 202 is rigid, unlike, in at least some embodiments, the cable 201. Because the sleeve 202 is rigid, the cable 201 (housed in the sleeve 202) can quickly be inserted through the tunnel 304a and coupled to the backplane 104. The guide pins 206 may also be used to ensure that the connectors 204, 116 are being properly blind-mated and to avoid any damage to the connectors 204, 116.

Without the sleeve 202, coupling the connector 204 to the connector 116 would be difficult, since the cabinet 100 may be crowded with wires and other electronic devices, and further because the chassis 300 minimizes or eliminates hand-maneuvering space. Because the sleeve 202 facilitates coupling together the connectors 204, 116, the amount of time it takes to install the cable assembly 200 is substantially shorter than the time it would take to install the cable 201 without the sleeve 200.

The process 600 further comprises using screws 208 to fasten the plate 212 to the chassis 300 (block 606), effectively fastening the cable assembly 200 to the chassis 300 to keep the assembly 200 from slipping out of place. The process 600 then comprises installing the electronic device 108 (e.g., in a server) if not already installed, and coupling connector 114 to the connector 210 (block 608), thereby establishing an electrical connection between the device 108 and the backplane 104.

In at least some embodiments, multiple electronic devices 108 may be housed together within a single system, such as a server (not specifically shown). For example, a server may house multiple (e.g., four) electronic devices 108 (e.g., cell boards), each device 108 receiving power from the backplane 104 via its own cable assembly 200. In some such embodiments, the electronic devices 108 housed in the server are hot-swappable, meaning that if one of the devices 108 fails, then that failed device 108 can be removed and fixed or replaced without having to power down the server and thus the other devices 108 contained therein. Similarly, an individual cable assembly 200 can be removed and replaced without having to power down all of the devices 108 within the server—only the device 108 connected to the removed cable assembly 108 would be powered down.

Figure 6B:
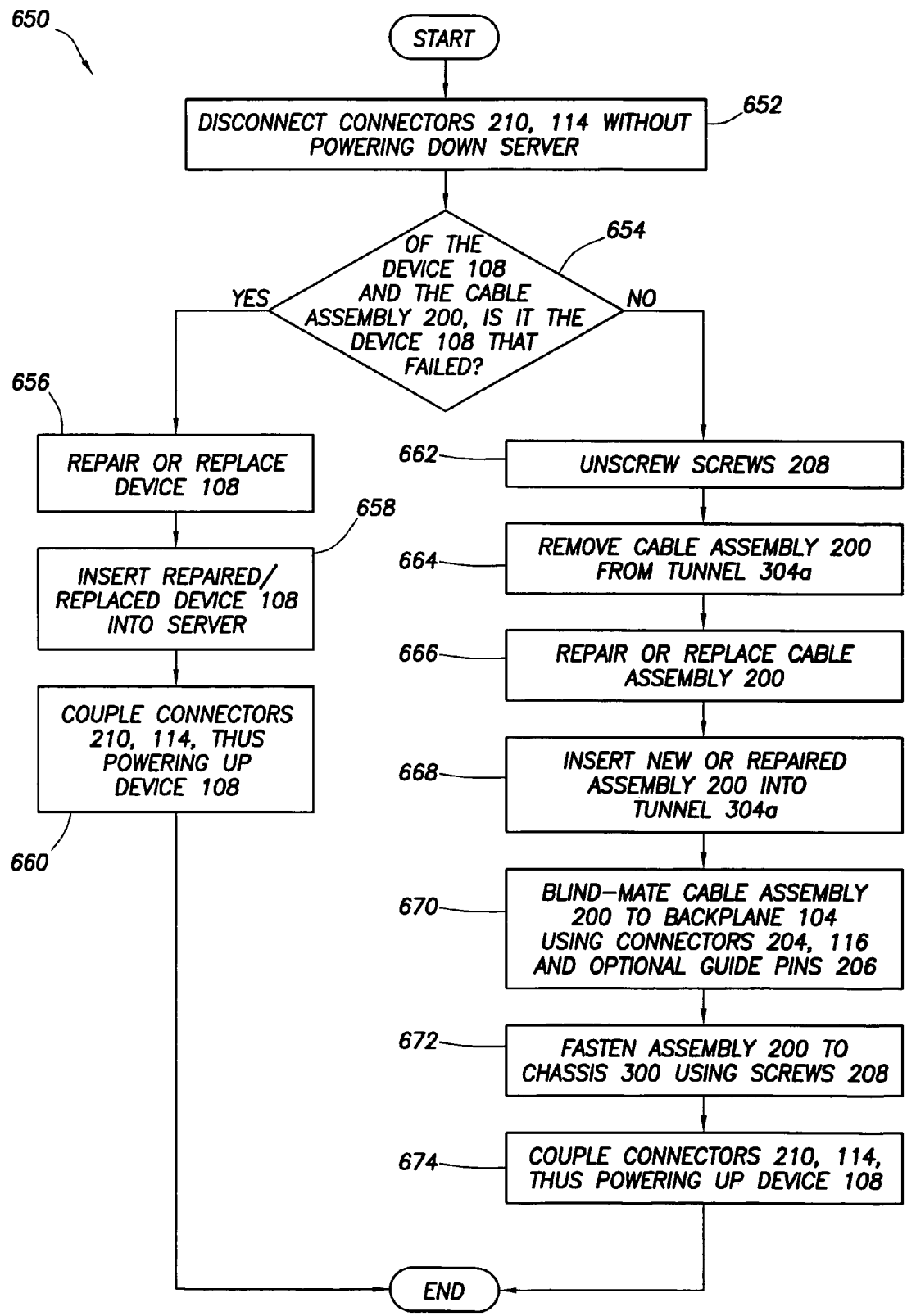

More specifically, in case either a device 108 (e.g., housed in a server) and/or a corresponding cable assembly 200 fails, the management processor 120 may detect the failure and may, in some instances, cut off power supply to the defective device 108 and the assembly 200. In some embodiments, the processor 120 also may cause a display (not shown) coupled to the cabinet and/or the server to display an alert message to a user, warning the user of the failure. In turn, the user may address the failure using a process 650 as shown in FIG. 6b.

The process 650 comprises disconnecting the connectors 210, 114 without powering down the server (block 652). By disconnecting the connectors 210, 114, the device 108 is powered down, but the server otherwise continues to function. Thus, the device 108 is "hot-swappable." In case it is the device 108 that has failed (block 654), the process 650 comprises repairing or replacing the device 108 (block 656), inserting the repaired or replaced device 108 into the server (block 658), and coupling the connectors 210, 114 to power up the device 108 (block 660). However, in case the cable assembly 200 is defective (block 654), the process 650 comprises unscrewing the screws 208 (block 662) and pulling out the cable assembly 200 from the tunnel 304a (block 664). The process 650 then comprises repairing or replacing the cable assembly 200 (block 666) and inserting the repaired or replaced cable assembly 200 into tunnel 304a (block 668). The process 650 further comprises inserting the cable assembly 200 into the tunnel 304a, blind-mating the assembly 200 to the backplane 104 (block 670) using connectors 204, 116 and the guide pins 206, and fastening the assembly 200 to the chassis 300 using the screws 208 (block 672). Finally, the connector 114 of the device 108 is mated to the connector 210 of the cable assembly 200 (block 674), thus powering the device 108.

The above discussion is meant to be illustrative of the principles and various embodiments of the present invention. Numerous variations and modifications will become apparent to those skilled in the art once the above disclosure is fully appreciated. For example, although the embodiments are described above as being used to transfer power, they also may be used to transfer electrical data signals. It is intended that the following claims be interpreted to embrace all such variations and modifications.

What is claimed is:

1. A cable assembly, comprising:
   a hollow sleeve;
   an electrical conductor within the hollow sleeve; and
   first and second connectors on opposing ends of the electrical conductor that are fastened to opposing ends of the sleeve;
   wherein the first connector is adapted to blind-mate to a corresponding connector on a cabinet backplane and the second connector is adapted to couple to an electronic device in the cabinet;
   wherein power is provided from the backplane to the electronic device via the electrical conductor;
   wherein the hollow sleeve is adapted for placement within a tunnel supported by these cabinet, the hollow sleeve having a length greater than that of said tunnel such that the first connector protrudes from a first opening of the tunnel to couple to the corresponding connector on the cabinet backplane and the second connector protrudes from a second opening of said tunnel to couple to the electronic device in the cabinet.

2. The cable assembly of claim 1, wherein the sleeve is more rigid than the electrical conductor.

3. The cable assembly of claim 1, wherein the sleeve comprises plastic.

4. The cable assembly of claim 3, wherein the plastic is selected from the group consisting of acrylonitrile-butadiene-styrene and polyvinyl chloride.

5. The cable assembly of claim 1, wherein the resistivity of the sleeve is approximately $10^8$ Ohms/square unit.

6. The cable assembly of claim 1 further comprising a plate abutting the second connector and the sleeve, wherein the plate is fastened to a structure external to the cable assembly to secure the cable assembly in place.

7. The cable assembly of claim 1, wherein the electrical conductor is selected from the group consisting of a cable and a metal bar.

8. An electrical cabinet, comprising:
   a backplane capable of providing power via a plurality of first connectors;
   multiple electronic devices, each device capable of receiving power from at least one of the first connectors; and
   multiple hollow sleeves, each sleeve having opposing ends and comprising an electrical conductor having a second connector fastened to one end, and each sleeve installed in the cabinet by blind-mating the second connector to one of the first connectors;
   wherein each electronic device is coupled to an end of a sleeve not having a second connectors;
   wherein at least one of the electronic devices comprises a computer.

9. The electrical cabinet of claim 8, wherein at least one of the sleeves comprises plastic.

10. The electrical cabinet of claim 9, wherein the plastic is selected from the group consisting of acrylonitrile-butadiene-styrene and polyvinyl chloride.

11. The electrical cabinet of claim 8, wherein at least one of the sleeves has a resistivity of about $10^8$ Ohms/square unit.

12. The electrical cabinet of claim 8, wherein at least one of the electrical conductors is more flexible than a corresponding sleeve.

13. The electrical cabinet of claim 8, wherein at least one of the electrical conductors is selected from the group consisting of a cable and a metal bar.

14. The electrical cabinet of claim 8, wherein at least one of the sleeves comprises a guide pin that is located adjacent to a corresponding second connector and that is used to blind-mate said corresponding second connector connectors to one of said first connectors.

15. A method, comprising:
    blind-mating multiple electrically conductive cables to a cabinet backplane using first connectors of the cable, each of said cables housed within a different hollow sleeve and having a different first connector; and
    providing power from the cabinet backplane to multiple electronic devices by coupling said electronic devices to second connectors of the cables, each cable having a separate second connector;
    wherein the first and second connectors of each sleeve protrude from and are fastened to opposing ends of said sleeve.

16. The method of claim 15, wherein blind-mating one of the cables to the cabinet backplane comprises using a cable housed within a plastic sleeve.

17. The method of claim 15, wherein blind-mating one of the cables to the cabinet backplane comprises using a cable housed in a plastic sleeve having a resistivity of approximately $10^8$ Ohms/square unit.

18. The method of claim 15, wherein blind-mating one of the cables to the cabinet backplane comprises blind-mating a first connector of said one of the cables to a corresponding connector on said backplane.

19. The method of claim 18, wherein blind-mating the first connector of said one of the cables to the corresponding connector comprises using a guide pin located on the sleeve of said one of the cables.

20. An apparatus, comprising:
    means for providing power from a cabinet backplane to an electronic device;
    means for coupling the electronic device and said means for providing power; and
    means for blind-mating the means for providing power to the cabinet backplane;
    wherein the means for providing power is adapted for placement within a tunnel supported by the cabinet, the means for providing power having a length greater than that of said tunnel such that the means for coupling protrudes from a first opening of the tunnel to couple to the electronic device and the means for blind-mating protrudes from a second opening of said tunnel to couple to the cabinet backplane.

21. The apparatus of claim 20, wherein the apparatus comprises multiple means for providing power such that if one of said multiple means for providing power fails, the electronic device is not shut down.

* * * * *

UNITED STATES PATENT AND TRADEMARK OFFICE
CERTIFICATE OF CORRECTION

| | | |
|---|---|---|
| PATENT NO. | : 7,214,100 B2 | Page 1 of 1 |
| APPLICATION NO. | : 11/273302 | |
| DATED | : May 8, 2007 | |
| INVENTOR(S) | : Vic Hong Chia et al. | |

It is certified that error appears in the above-identified patent and that said Letters Patent is hereby corrected as shown below:

In column 6, line 28, in Claim 1, delete "these" and insert -- the --, therefor.

In column 6, line 63, in Claim 8, delete "connectors" and insert -- connector --, therefor.

Signed and Sealed this

Twenty-sixth Day of August, 2008

JON W. DUDAS
*Director of the United States Patent and Trademark Office*